United States Patent [19]

Araps et al.

[11] Patent Number: 5,147,741
[45] Date of Patent: Sep. 15, 1992

[54] PHENYL-ENDCAPPED DEPOLYMERIZABLE POLYMER

[75] Inventors: Constance J. Araps, Wappingers Falls; Jon A. Casey, Poughkeepsie, both of N.Y.; Renuka S. Divakaruni, Ridgefield, Conn.; Steven M. Kandetzke, Poughkeepsie; Catherine A. Lotsko, Beacon, both of N.Y.

[73] Assignee: International Business Machines Corporation, Armonk, N.Y.

[21] Appl. No.: 602,013

[22] Filed: Oct. 23, 1990

Related U.S. Application Data

[60] Division of Ser. No. 423,505, Oct. 13, 1989, Pat. No. 4,987,211, which is a continuation of Ser. No. 28,822, Mar. 20, 1987, abandoned.

[51] Int. Cl.$^5$ ............................................. G03F 9/00
[52] U.S. Cl. ...................................... 430/5; 430/311; 430/314; 526/251
[58] Field of Search .................... 430/5, 311, 314; 526/251

[56] References Cited

U.S. PATENT DOCUMENTS

| | | | |
|---|---|---|---|
| 4,456,675 | 6/1984 | Anderson, Jr. et al. | 430/256 |
| 4,519,872 | 5/1985 | Anderson, Jr. et al. | 430/314 |
| 4,539,222 | 9/1985 | Anderson, Jr. et al. | 430/314 |
| 4,987,211 | 1/1991 | Araps et al. | 526/251 |

Primary Examiner—Marion E. McCamish
Assistant Examiner—Mark A. Chapman
Attorney, Agent, or Firm—Ira David Blecker

[57] ABSTRACT

Phenyl-endcapped depolymerizable polymers are disclosed. The phenyl endcap eliminates the reactive terminal vinyl group resulting in increased depolymerization threshold temperatures and reduced residue after depolymerization. A multilevel metal lift-off process using the phenyl-endcapped polymers is disclosed. Additionally, the polymers are improved ceramic glass binder resins.

10 Claims, 1 Drawing Sheet

PHENYL-ENDCAPPED DEPOLYMERIZABLE POLYMER

This is a request for filing a divisional application under 37 CFR 1.60, of pending prior application Ser. No. 07/423,505 filed on Oct. 13, 1989, now U.S. Pat. No. 4,987,211, which is a File Wrapper Continuing Application of Ser. No. 07/028,822, filed on Mar. 20, 1987, now abandoned.

BACKGROUND OF THE INVENTION

The present invention relates to phenyl-endcapped depolymerizable polymers having increased depolymerization threshold temperatures and reduced residue after depolymerization. More particularly, the invention relates to phenyl-endcapped poly(methyl methacrylate) and poly(alpha-methyl styrene) and their use as lift-off materials and ceramic binders.

Poly(methyl methacrylate) and poly(alpha-methyl styrene) are thermally depolymerizable polymers. These polymers depolymerize by "unzipping," that is they essentially undergo a complete reverse of polymerization, regenerating the gaseous monomer or monomers from which the unzippable polymer was formed.

For use as lift-off materials and binders, an optimal thermally depolymerizable polymer should have the following properties:

1) It should not depolymerize below a given threshold temperature that is above the highest temperature that the structure is exposed to during intermediate process steps.
2) It should not leave any residue after depolymerization.
3) It should have good sheet or film-forming properties.

Lift-off processes are well known in the art, especially for applying metallization patterns to semiconductors. In such a process, a sacrificial layer is deposited and patterned with the inverse of the desired metallurgy pattern. Following blanket metallization, the sacrificial layer is dissolved, "lifting off" the metal in the undesired areas. U.S. Pat. Nos. 4,519,872, 4,539,222 and 4,456,675 describe lift-off layers comprising poly(methyl methacrylate) or poly(alpha-methyl styrene). These films undergo rapid weight loss at temperatures of 275°–315° C. This creates a problem when argon sputter cleaning at 240° C. is used prior to metallization, because the polymers begin to unzip at this temperature.

Binders are normally comprised of simple solvent soluble thermoplastic organic polymers having good film-forming properties which are nonvolatile at moderate temperatures but which will volatilize with other constituents of the resin system on firing of the green sheet to the final sintered state. A commonly used binder resin is poly(vinyl butyral). However, where low temperature systems, such as glass ceramic substrates, are used, the maximum temperature for binder removal is much lower due to the coalescence of the glass particulate at about 800°–875° C. Thus, after the glass has coalesced, any remaining binder residue will become entrapped in the glass body. Failure to completely remove the binder in the initial stages of the heat treatment process can result in the evolution of gas during the final sintering stage. This gives rise to pores in the material or, in extreme cases, to blow holes.

Glass ceramic substrates are typically used with copper metallurgy. Copper metallurgy precludes the use of oxidizing ambients during binder burn-off. As disclosed in U.S. Pat. No. 4,234,367, it has been found that conventional binder resins, such as poly(vinyl butyral), are not easily burnt out in these non-oxidizing atmospheres. This can result in black or darkened substrates that are not fully sintered. The black or darkened color is generally attributed to carbon residue. The carbon remaining in the ceramic can form conduction paths which lead to lower insulation resistance by many orders of magnitude and to increased dielectric losses.

The use of unzipping polymers such as free radical polymerized poly(methyl methacrylate), poly(alpha-methyl styrene) and polyisobutylene, has been disclosed in IBM Technical Disclosure Bulletin, July 1979, p. 542 to Anderson, et al. and in U.S. Pat. No. 4,598,107. These polymers have cleaner burn-out and minimal residue formation in an inert atmosphere as compared to poly(vinyl butyral). A problem with these polymers is that as a result of the free radical polymerization process by which they are formed, there is rather limited control in molecular weight distribution and end groups. Furthermore, the reactive terminal vinyl group promotes crosslinking which leads to carbonaceous residues. This residue will not be removed in low temperature or non-oxidizing systems.

U.S. Pat. No. 4,550,061 discloses the use of alpha-substituted styrene polymers or polymers derived from alpha-substituted acrylate monomer as binders for electro-erosion printing media. The materials have decreased residue after decomposition (less than 2%).

U.S. Pat. No. 4,474,731 discloses a process for the removal of carbon residues formed during sintering of ceramics.

SUMMARY OF THE INVENTION

It is, therefore, an object of the present invention to improve the materials used for lift-off and as binders.

It is a further object of the invention to increase the depolymerization temperature of the polymers used for lift-off.

It is another object of the invention to eliminate residues produced when depolymerizable polymers unzip.

In accordance with these and other objects, the present invention discloses phenyl-endcapped thermally depolymerizable polymers. Such polymers generally fall within a class having the following regular structure:

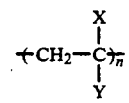

$X = CH_3$, CN, $CF_3$, tert-butyl, etc.

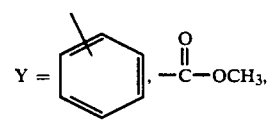

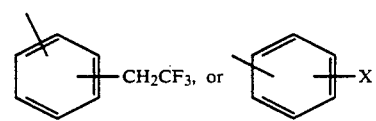

where X is as above defined, etc.

X and Y represent substituents that are thermally stable and cannot be cleaved from the polymer backbone upon heating at conditions as are used in the present invention to unzip the polymer and n is selected so as to provide the desired molecular weight. Currently preferred thermally depolymerizable polymers include poly(methyl methacrylate) and poly(alpha-methyl styrene).

The phenyl endcap eliminates the reactive terminal vinyl group. This decreases the vapor pressure of the bulk polymer at constant temperature and increases the depolymerization temperature. In addition, this eliminates a reactive site from possible reactions which form residues. The phenyl endcap stabilizes the terminal group thermally and quenches the radical/anion on the terminus. If unquenched, the terminal group "quenches" itself via elimination resulting in a terminal vinyl group.

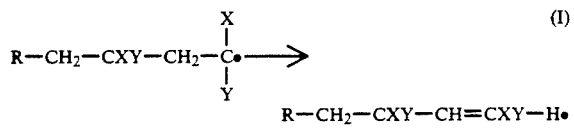

where R=phenyl, a phenyl derivative, or methyl, wherein a phenyl is preferred in this equation. This vinyl moiety can then become a new site for radical initiation upon heating via H abstraction. The vinyl group is not a thermally stable group. The vapor pressure of the bulk appears to increase upon heating and what results is radically induced chain scission and "unzipping." The radically induced unzipping of the polymer results in a wide variety of by-products with an accompanying wide variation in by-product volatility. Some of the by-products have very high volatilities which can cause problems in particular applications while other of the by-products are non-volatile and result in formation of undesirable residues during processing. By contrast, the phenyl-endcapped polymers have increased depolymerization temperatures (by 20-50° C.) and decreased residues as compared to the same polymers without phenyl endcaps.

A mask of the phenyl-endcapped polymer can be applied to a desired substrate, overlaid with a photoresist, patterned lithographically so as to remove the mask material in the desired pattern areas or vias, and a blanket conductive layer such as a metallization layer can be applied. Because of the increased depolymerization temperature, the phenyl-endcappped polymer does not unzip during sputter cleaning of surfaces such as argon sputter cleaning or deposition of the conductive layer such as the metallization layer. Upon heating the substrate to a higher temperature than that achieved during sputter cleaning or metallization, the polymer unzips. Adhesion of the blanket metal film is deteriorated sufficiently so that the metal spontaneously delaminates and metal stress causes it to roll up. At this point the metal may be blown away. Alternatively, the depolymerized polymer can be rapidly swelled and/or dissolved in a suitable solvent, due to its substantial reduction in MW and increased solubility of the smaller chain length fragments.

In another application, the phenyl-endcapped polymer can be used as a binder resin in forming ceramic compositions. The phenyl-endcapped polymers according to the present invention have improved "binder burn-out" when compared to such commonly used binders as poly(methyl methacrylate) or poly(vinyl butyral). Binder burn-out is the process step in which the green ceramic is heated to volatilize and remove the binder resin system. During binder burn-out, the phenyl-endcapped polymers decompose uniformly and completely, with little or no residue.

DESCRIPTION OF THE PREFERRED EMBODIMENTS

The phenyl endcapping represents a method of stabilizing polymers derived from vinyl monomers. These polymers fall within a class having the following regular structure:

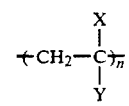

$X = CH_3$, CN, $CF_3$ tert-butyl, etc.

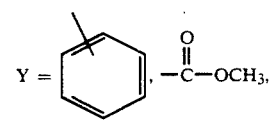

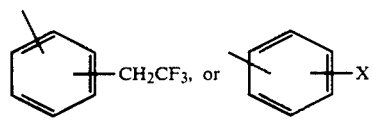

where X is as above defined, etc.

X and Y represent substituents that are thermally stable and cannot be cleaved from the polymer backbone upon heating at conditions as are used in the present invention to unzip the polymer and n is selected so as to provide the desired molecular weight. Use of a phenyl endcap on such polymers stabilizes the polymer relative to reversal of the polymerization process, i.e. radical depolymerization, or the direct reversal of the reaction mechanism for polymerization. Polymer synthesis and endcapping can be either radical or anionic.

PREPARATION OF PHENYL-ENDCAPPED POLYMERS

Synthesis of the polymers can be achieved via either radical or anionic polymerization using a variety of commercially available, common catalysts and/or heat, as is well known in the art:

Radical:

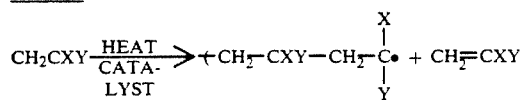

-continued

Intermediates (II)

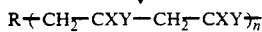

$$R \!\!\leftarrow\!\! CH_2\!-\!CXY\!-\!CH_2\!-\!CXY \!\!\rightarrow\!\!_{\overline{n}}$$

Anionic:

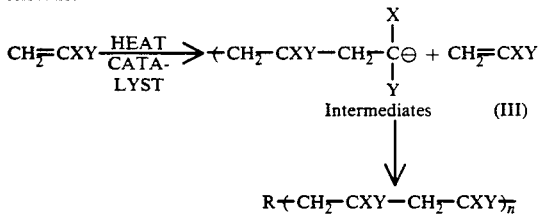

$$R \!\!\leftarrow\!\! CH_2\!-\!CXY\!-\!CH_2\!-\!CXY \!\!\rightarrow\!\!_{\overline{n}}$$

where $X=CH_3$ and $Y=COOCH_3$ for poly(methyl methacrylate) or where $X=CH_3$ and $Y=C_6H_5$ for poly-(alpha-methyl styrene), and where $R=$phenyl, a phenyl derivative or methyl, wherein a phenyl is preferred.

Fractionation of the polymer to remove low MW oligomers and impurities will increase the depolymerization temperature ($T_D$) of the polymer. Addition of 1% Irganox radical trapping agent to scavenge radicals formed prior to main chain polymer depolymerization will also increase $T_D$. Molecular weight of the polymer should be 50,000 to 150,000, with the preferred range being about 60,000 to 90,000.

The endcapping is achieved by quenching the growing, reactive polymer chain with a radical or anionic trapping agent:

Radical:

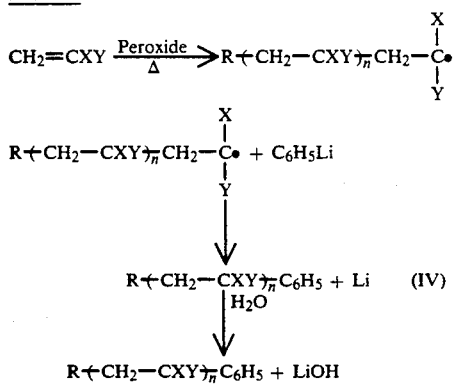

Anionic:

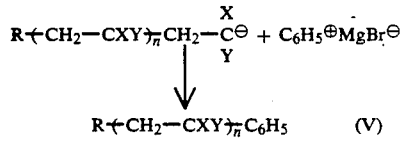

$$R \!\!\leftarrow\!\! CH_2\!-\!CXY \!\!\rightarrow\!\!_{\overline{n}} C_6H_5 \quad (V)$$

where R, X. and Y are as defined above.

Lift-off process

A multilevel metal process using the phenyl-endcapped polymers of the present invention comprises the following generalized sequence of steps.

Figure 1:
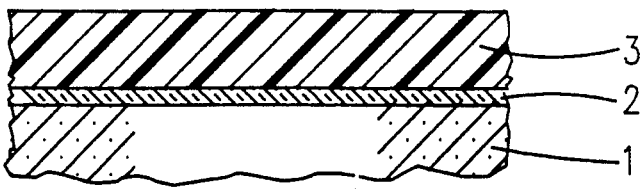
FIGS. 1-5 show the lift-off process resulting in metal structures embedded in a passivating layer with a planarized surface.

1. Forming a cured organic polymer layer 3 such as polyimide on a substrate 1 which is typically monocrystalline silicon with a dielectric layer 2 which is typically a silicon oxide or silicon nitride, aving contact openings (not shown here) for contact with active and passive devices (FIG. 1). The material for this organic polymer layer can be a polyimide such as Pyralin (trademark of E. I. DuPont de Nemours), which is applied in thicknesses of 1-5 microns. For device fabrication the preferred thickness of the organic polymer layer is about 1-2 microns while for packaging about 4-5 micron thick films can be employed. For packaging applications, layers 1 and 2 would be replaced by dielectric layers such as ceramic, glass ceramic, glass or other insulating materials which can be employed according to the processes described herein to form conductive patterns on a module comprising integrated circuit devices and associated circuitry.

2. Deposition of a thin masking layer 4 by plasma or PECVD (plasma enhanced chemical vapor deposition), e.g., silicon nitride, silicon oxide or plasma polymerized organosilicons. (FIG. 2) Solution coated glass resin type materials may also be used.

Figure 2:
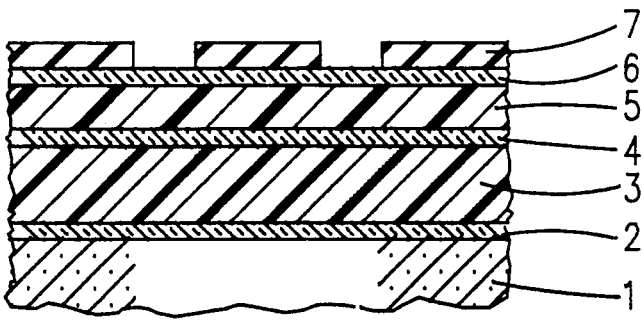

3. Application of a layer of the phenyl-endcapped polymer 5 according to the present invention by spincoating of a solution of the typically 10-40% by weight polymer in a suitable solvent such as diglyme or 2-methoxy ethyl ether (FIG. 2). Thickness of the layer will be of the order of about 0.5-2.0 microns for devices and about 5-10 microns for packaging. This is followed by a bake cycle of about 85° C. for 15 minutes for device fabrication or about 150°-260° C. for 1 hour for packaging fabrication.

4. Deposition of an oxygen reactive ion etch resistant layer 6 of the type described in Step 2 above, to serve as a barrier during image transfer into the underlying layers by RIE (Reactive Ion Etching) in an $O_2$ containing ambient. (FIG. 2)

5. Deposition of a resist layer 7 by spin coating, followed by prebake at an appropriate temperature. The thickness of the film is typically on the order of 1-3 microns. (FIG. 2) The resist can be any of those well known in the art, including novolak resist materials.

6. Exposure and image development of the resist according to techniques well known in the art to delineate the desired conductive pattern. (FIG. 2) Depending on the resist, exposure can be by optical, E-beam, X-ray or ion beam.

Figure 3:
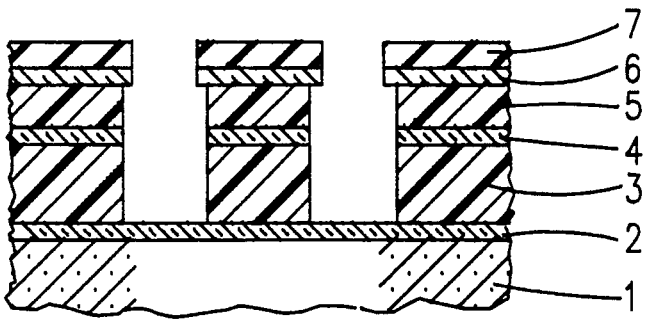

7. Replication of the resist pattern in the underlying layers by RIE in $CF_4$ containing ambients to etch barrier layers and in $O_2$ containing ambients to etch the lift-off layers. (FIG. 3)

8. An optional step of sputter cleaning of the substrate may be used at this time.

Figure 4:
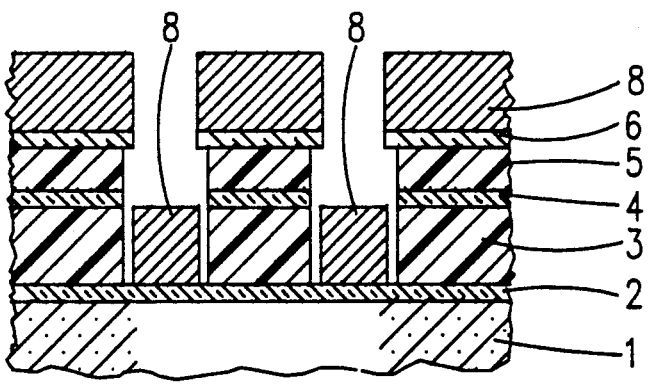

9. Deposition of a conductive material, such as evaporation of a metal layer 8, such as Al/Cu or Cr-Cu-Cr alloy by E-beam or RF evaporation. (FIG. 4) The thickness of layer 8 is preferably approximately equal to that of layer 3.

Figure 5:
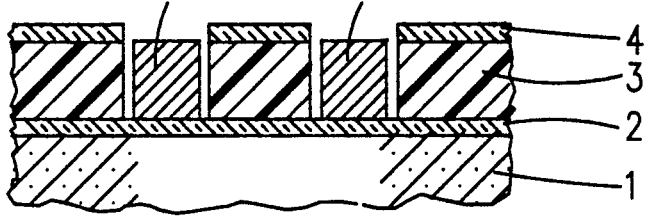

10. Brief thermal treatment of the structure to depolymerize the phenyl-endcapped polymers. Phenyl-endcapped poly(methyl methacrylate) depolymerizes completely in 3-4 minutes at 350° C. or 6-8 minutes at 330° C. TD (the temperature at which depolymerization occurs) is 320° C. and no depolymerization is seen at 300° C. Adhesion of the blanket metallic film is deteriorated sufficiently so that the metallic film spontaneously delaminates and metal stress causes it to roll up. At this point the metal may be blown away. Alternatively, solvent assisted lift-off may be used. (FIG. 5) If sufficient time is spent above $T_D$ the thermal depolymerization can be complete to the point of leaving no residue provided that the polymer was very pure and did not contain any branched groups or residual vinyl groups on the backbone.

11. Steps 1–10 can be repeated to give further levels of metallurgy.

UV analysis has indicated a small shift of 2–5% in the UV absorbance of phenyl-endcapped poly(methyl methacrylate) as compared to unsubstituted poly(methyl methacrylate). Therefore, resist properties and high temperature lift-off properties can be combined in a single 2 micron thick film. Taking advantage of this property, Step 5 can be eliminated and the phenyl-endcapped poly(methyl methacrylate) can be directly patterned. In this case, exposure will be by E-beam. This greatly simplifies the lithographic process and permits a totally dry development and lift-off sequence.

Figure 6:
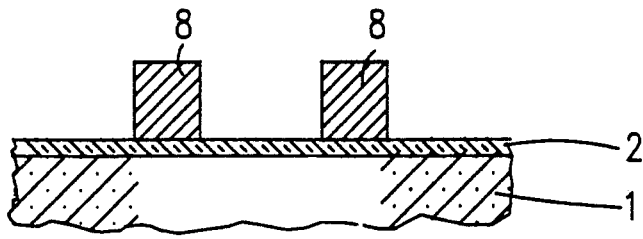
FIG. 6 shows an alternative embodiment of the lift-off process in which the metal structures are not embedded.

Steps 1–10 result in metal structures embedded in a passivating layer with a planarized surface. In an alternative embodiment, Steps 1 and 2 can be eliminated to provide metal structures which are not embedded, as shown in FIG. 6.

BINDER RESIN PROCESS

The depolymerizable polymers of the present invention are particularly useful as binder resins in the fabrication of glass ceramic substrate carriers for mounting of semiconductor or integrated circuit chips. Glass ceramics allow sintering at lower temperatures (less than 1000° C.) than that possible with alumina-based ceramics, which require sintering temperatures in excess of 1400° C. This allows less refractory metallurgies, such as copper and gold, to be used.

The ceramic slurry for manufacture of ceramic green sheets from glass ceramic is formulated, in accordance with usual practice, from ground glass, a binder resin system and a solvent system. The function of the binder resin system is to provide adhesive and cohesive forces to hold the ground glass together in its green sheet configuration. The solvent system is a volatile composition whose role is to dissolve the binder resin system into solution, to aid in uniformly mixing the binder resin with the ground glass, and to provide the necessary viscosity to the resultant ceramic slurry for subsequent casting. The sintered ground glass forms the substrate material in the ultimately fired structure.

Starting materials for formulation of ceramic slurry in accordance with the present invention comprise liquid solvents (e.g. isopropyl alcohol, acetone, ethyl acetate, hexane, 1-butanol), phenyl-endcapped poly(methyl methacrylate) or poly(alpha-methyl styrene) as prepared above, a resin plasticizer (e.g. dibutyl phthalate), and a glass ceramic. Typical glass ceramic can have either beta-spodumene ($Li_2.Al_2O_3.4SiO_2$) or cordierite ($2MgO.2Al_2O_3.5SiO_2$) as the main crystalline phase. The general composition ranges for such glass ceramics are described in U.S. Pat. No. 4,301,324, assigned to the assignee of the present invention and incorporated herein by reference.

The substrate fabrication process involves the following illustrative basic steps:

1. The cullet of the chosen crystallizable glass is ground to average particle sizes in the range of 2 to 7 micrometers. The grinding can be done in two stages, a preliminary dry or wet grinding to 400 mesh particle size followed by further grinding with suitable organic binders and solvents until the average particle size is reduced to between 2 and 7 micrometers and a castable slurry is obtained. A single stage prolonged grinding of cullet in the medium of the binder and solvent, until the desired particle sizes are obtained can also be used. In the latter case, a filtering step may be necessary to remove oversized particles.

The actual quantities of solvent and polymer are chosen to provide the necessary viscosity in the ceramic slurry to form on casting a cohesive ceramic sheet. Generally, this can be obtained by maintaining the ratio, in parts by weight, of the polymer to solvent system in the general range of 1:2 to 1:12, and preferably 1:5 to 1:7. The specific quantity of the solvent system in the ceramic slurry will normally be that which will provide a viscosity in the broad range of about 500 to about 2,000 mPa.s at a temperature of about 25° C., preferably from about 800 to about 1,000 mPa.s at a temperature of about 25° C.

Generally, the ceramic slurry will comprise from about 40 to about 60 wt. percent of ceramic glass and from about 60 to about 40 wt. percent of binder resin system and solvents. The binder resin system will comprise from about 0–10% plasticizer, with the remainder of the system being phenyl-endcapped polymer and solvents. A preferred embodiment comprises about 52.7% ceramic glass, about 4.4% phenyl-endcapped polymer, about 1.9% dibutyl phthalate, about 16.3% isopropyl alcohol and about 24.7% acetone.

2. After blending of the ceramic slurry, it is filtered, deaerated and cast on a removable flexible supporting tape, such as Mylar (a glycol terephthalic acid polyester) or Teflon (polytetrafluoroethylene) (both trademarks of E. I. DuPont de Nemours). The slurry may be slightly compressed, spread and leveled by use of a doctor blade to provide on drying green ceramic sheets having a thickness in the range of 1–15 mils.

3. The cast ceramic slip is dried by evaporation of the solvent system at temperatures providing controlled volatilization in accordance with well-known principles in the art, which minimize bubbling, cracking, buckling, volatilization of plasticizer, and the like, of the drying ceramic slip. The drying temperature is typically 25°–50° C. and the drying time depends on the thickness of the cast ceramic slip and the air or ambient flow across the evaporation surface during drying.

4. The resulting green sheet, after removal of the mylar supporting tape, is cut into green sheet units of the desired size and via holes are punched through them in the required configuration. A metallizing paste of copper is extruded into the via holes in the individual sheets.

5. A copper paste or ink is then screen printed on selected units in the patterns desired for electrical conduction. The solvent is evaporated from the coated composition.

6. The green sheet units are stacked on each other in proper relation. The assembly is then laminated in a laminating press. The temperature and pressure employed for lamination should be such as to cause the individual green sheets to bond to each other and to cause the green ceramic to sufficiently flow and enclose the conductor patterns.

7. After lamination the green laminate is cut to final shape and fired in a furnace under an exidizing, neutral or reducing atmosphere for burn-off of the phenyl-endcapped polymer, sintering or coalescence of the glass particles, and conversion to a glass ceramic by crystallization with concurrent sintering of the metal particles in the conductor patterns. Burn-off of the phenyl-endcapped polymer occurred between 250°-450° C.

While the invention has been particularly shown and described with reference to preferred embodiments, it will be understood by those skilled in the art that changes in form and detail may be made without departing from the spirit and scope of the invention. For example, the phenyl-endcapped polymers may be used as binders with other systems, such as alumina-based ceramics. Furthermore, phenyl endcapping of PMMA photoresist will improve its resistance to dry etch processing, allowing it to be used in a greater variety of manufacturing environments.

We claim:

1. A method for forming a conductive pattern on a substrate which comprises the steps of:
   depositing over said substrate a blanket layer of a depolymerizable polymer selected from the group consisting of phenyl-endcapped poly (methyl methacrylate) and phenyl-endcapped poly (alpha-methyl styrene);
   patterning said depolymerizable polymer to form a mask complementary to the desired metal pattern;
   coating a blanket layer of a conductive material over said mask;
   thermally depolymerizing said mask to cause said blanket layer of conductive material to spontaneously delaminate and roll up; and removing said depolymerized mask and the conductive material thereon.

2. The method according to claim 1 wherein said patterning step further comprises exposure and development of said depolymerizable polymer.

3. The method according to claim 1 wherein said patterning step further comprises depositing a layer of photoresist and exposing and developing said layer of photoresist.

4. The method according to claim 1 wherein said conductive material is metallic.

5. The method of claim 1 wherein the step of removing comprises blowing away said delaminated layer of conductive material.

6. A method for forming a conductive pattern on a substrate which comprises the steps of:
   depositing over said substrate a blanket layer of a depolymerizable polymer selected from the group having the following regular structure:

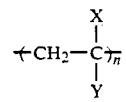

where $X = CH_3$, CN, $CF_3$, tert-butyl and

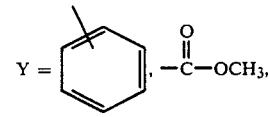

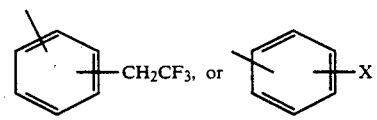

where x is as above defined and wherein terminal end groups of the polymer have been capped with a phenyl group;
   patterning said depolymerizable polymer to form a mask complementary to the desired metal pattern;
   coating a blanket layer of a conductive material over said mask;
   thermally depolymerizing said mask to cause said blanket layer of conductive material to spontaneously delaminate and roll up; and
   removing said depolymerized mask and the conductive material thereon.

7. The method according to claim 6 wherein said patterning step further comprises exposure and development of said depolymerizable polymer.

8. The method according to claim 6 wherein said patterning step further comprises depositing a layer of photoresist and exposing and developing said layer of photoresist.

9. The method according to claim 6 wherein said conductive material is metallic.

10. The method of claim 6 wherein the step of removing comprises blowing away said delaminated layer of conductive material.

* * * * *